Jan. 10, 1967 G. J. FRYE 3,297,885
VARIABLE WIDTH PULSE GENERATOR EMPLOYING INDEPENDENTLY OPERATED
SWITCHES FOR CONTROLLABLY DISCHARGING TRANSMISSION LINE
Filed March 6, 1964

GEORGE J. FRYE
INVENTOR
BY
BUCKHORN, BLORE, KLARQUIST & SPARKMAN
ATTORNEYS 3,297,885

VARIABLE WIDTH PULSE GENERATOR EMPLOYING INDEPENDENTLY OPERATED SWITCHES FOR CONTROLLABLY DISCHARGING TRANSMISSION LINE

George J. Frye, Portland, Oreg., assignor to Tektronix, Inc., Beaverton, Oreg., a corporation of Oregon
Filed Mar. 6, 1964, Ser. No. 349,877
10 Claims. (Cl. 307—88.5)

Figure 1:
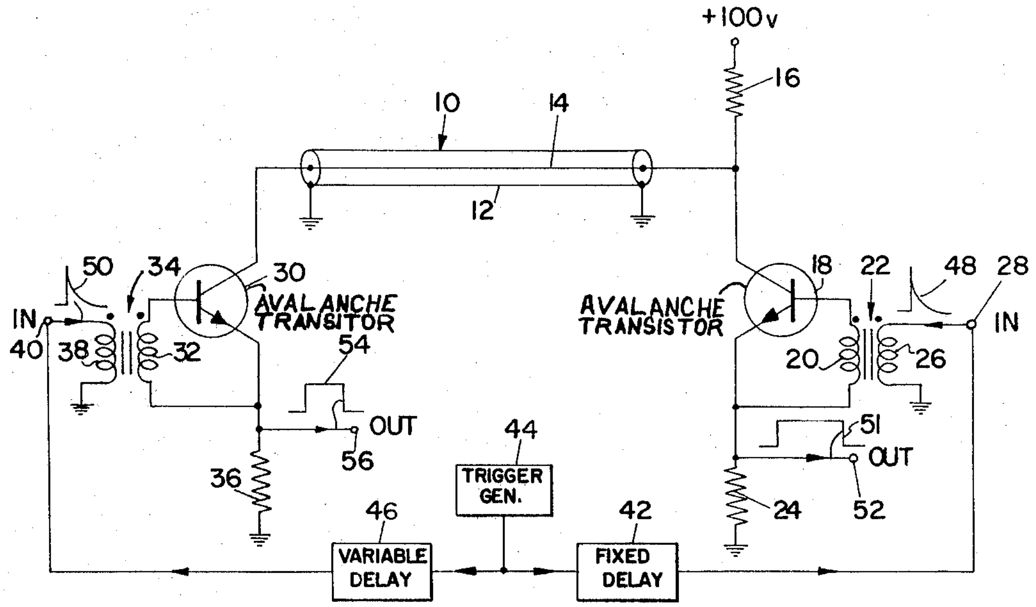

The subject matter of the present invention relates generally to electrical pulse generator circuits, and in particular to pulse generator circuits which produce output pulses having a pulse width which may be varied by applying two different trigger pulses to such pulse generator and varying the time interval between such trigger pulses.

The pulse generator of the present invention is especially useful in an apparatus for testing transistors by a cathode ray oscilloscope, as a source of high voltage pulses having fast rise and fall times and a pulse width which is variable over a wide range. For example, in one embodiment of the pulse generator of the present invention the output pulses are of 35 volts amplitude, have similar rise and fall times of about ½ nanosecond and having a pulse width which can vary between about zero and 100 nanoseconds. It should be noted that the maximum pulse width is determined by twice the time delay of a charged transmission line employed in such pulse generator and so that the time delay of the example given above is 50 nanoseconds which is the time it takes for the voltage pulse to travel from one end of such line to the other. Therefore this maximum pulse width can be increased by employing transmission lines having a greater time delay.

The pulse generator of the present invention has several advantages over conventional pulse generators, including the production of pulses having fast rise times and fall times which are substantially the same and which remain constant for pulses of different widths. Another advantage of the present pulse generator is that it is capable of producing variable width rectangular pulses of high voltage, having substantially no waveform distortion. Furthermore, the present pulse generator is a signal source of substantially constant impedance equal to the characteristic impedance of the transmission line for a time which is as long as the width of the output pulse, so that any signal reflections from the load impedance will be absorbed by the signal source and will not distort the output pulse.

It is, therefore, one object of the present invention to provide an improved pulse generator for producing high voltage pulses having fast rise and fall times.

Another object of the present invention is to provide an improved pulse generator of simple and inexpensive construction.

A further object of the present invention is to provide an improved pulse generator for producing output pulses whose width may be varied over a wide range by applying trigger pulses to such generator to produce output pulses having predetermined pulse widths with great accuracy.

An additional object of the invention is to provide an improved pulse generator circuit which produces rectangular voltage pulses of different widths with substantially no waveform distortion.

Still another object of the present invention is to provide a pulse generator circuit which produces high voltage output pulses having fast rise times and fast fall times which are substantially equal and are maintained substantially constant for pulses of different widths.

A still further object of the invention is to provide an improved pulse generator which serves as a signal source of substantially constant impedance for a long period of time so that any signal reflections from a load connected to the output of such pulse generator are absorbed within the pulse generator to prevent distortion of the output pulse of such generator and to prevent erroneous pulses from appearing at the load during the time interval following the output pulse of such generator.

Figure 2:
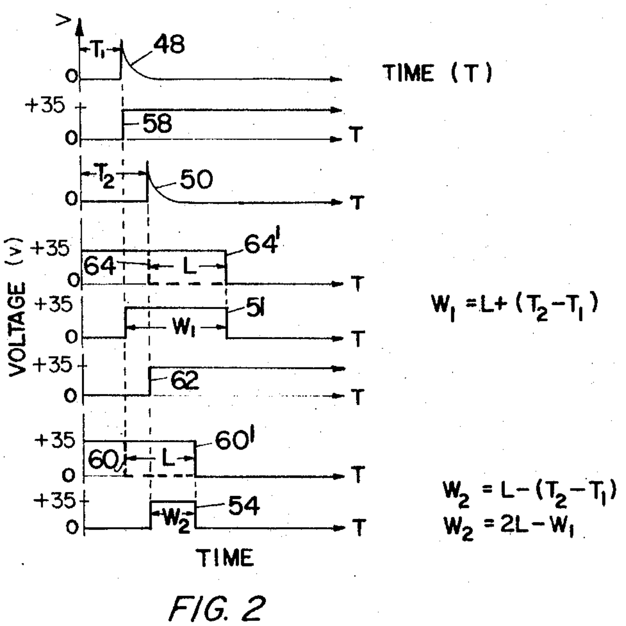

Other objects and advantages of the present invention will be apparent from the following detailed description of a preferred embodiment thereof and from the attached drawings of which:

FIG. 1 is a schematic diagram of one embodiment of the pulse generator circuit of the present invention; and FIG. 2 shows the waveforms of trigger pulses applied to and output pulses produced by the circuit of FIG. 1 in time relationship to one another.

As shown in FIG. 1, one embodiment of the pulse generator circuit of the present invention includes a transmission line 10 which may be a coaxial cable having an outer shield conductor 12 which is grounded at both ends thereof and an inner signal conductor 14 supported within such shield conductor. Such transmission line may have a uniform characteristic impedance of about 50 ohms and be of a length to provide a time delay of about 50 nanoseconds for a signal transmitted from one end of such line to the other. One end of the signal conductor 14 is connected to a source of positive D.C. bias voltage of +100 volts through a charging resistor 16 having a resistance of about 1000 ohms. The common connection of the charging resistor 16 and one end of the signal conductor 14 of the transmission line is connected to the collector of a first switching transistor 18 which may be of an NPN type 2N706. The base of transistor 18 is connected through the secondary winding 20 of a first input transformer 22 to the emitter of such transistor and the emitter of transistor 18 is connected to ground through a load impedance 24 which is represented by a resistor but may contain inductance and capacitance.

The input transformer 22 has a primary winding 26 with one end connected to ground and its other end connected to a trigger input terminal 28. The switching transistor 18 is normally biased nonconducting so that current flowing through the charging resistor 16 from the D.C. voltage source of +100 volts charges the distributed capacitance of the transmission line 10 to a voltage equal to that of such source. This means that an extremely high reverse bias voltage is applied to the collector of transistor 18 so that such transistor operates as an avalanche transistor. Thus the switching transistor provides a current gain greater than 1, due to avalanche multiplication in the collector junction of the transistor when a positive input signal is applied to the base thereof by means of transformer 22. This forward biases the emitter junction of transistor 18 and renders it rapidly conducting.

The other end of the signal conductor 14 is connected to the collector of a second switching transistor 30, which may be of an NPN type 2N706 having similar characteristics to transistor 18. The base of transistor 30 is connected through the secondary winding 32 of a second input transformer 34 to the emitter of such transistor and such emitter is connected through a load resistor 36 of about 50 ohms to ground. Thus, the second transistor 30 is also normally biased nonconducting along with the first transistor 18 to enable the transmission line 10 to charge to the voltage of the +100 volt source is connected to charging resistor 16. This charge voltage is applied to the collector of such second switching transistor, so that it operates as an avalanche transistor in a similar manner to transistor 18. The primary winding 38 of the second transformer 34 has one end grounded and its other end connected to a trigger input terminal 40 in order to apply a second positive input signal to the base of the second switching transistor 30 to render such transistor conducting.

The first trigger input terminal 28 is connected through a signal delaying network 42 providing a fixed time delay to a trigger pulse generator 44. The second trigger input terminal 40 is connected to the trigger pulse generator through a variable delay network 46. Thus, the variable delay network can be adjusted so that a first trigger pulse 48 from the trigger pulse generator is applied to input terminal 28 at a different time than a second trigger pulse 50 is applied to input terminal 40. In the case illustrated in FIGS. 1 and 2, the first trigger pulse 48 is applied before the second trigger pulse 50 by making the time delay of the variable delay network 46 greater than that of the fixed delay network 42. However, this can be changed by making the time delays equal so that the trigger pulses are applied simultaneously or the second trigger pulse 50 is applied before the first trigger pulse 48 by adjusting the variable delay network 46 until its delay is less than that of the fixed delay network 42. In this manner the time when the switching transistors 18 and 30 are rendered conducting can be controlled so that an output pulse 51 is transmitted to an output terminal 52 connected across the load resistor 24 whose width can be varied between a lower limit of approximately zero to an upper limit of 100 nanoseconds which is twice the time delay of the transmission line 10. In addition, it is also possible to produce a second output signal 54 by providing a second output terminal 56 connected across the load resistor 36 at the emitter of transistor 30. The width of the second output signal 54 varies with that of the first output signal.

The operation of the circuit of FIG. 1 is best understood when described with reference to the signal waveforms of FIG. 2. As shown at time $T_1$ the first trigger pulse 48 is applied to the input terminal 28 of transformer 22 and renders the switching transistor 18 conducting so that a positive step voltage 58 having an amplitude equal to +35 volts or one half the difference between the charge voltage of +100 volts on the transmission line 10 and the avalanche sustaining voltage of +30 volts of such transistor, is transmitted from the right end of the signal conductor 14 connected to the collector of transistor 18, through such transistor to output terminal 52. This positive step voltage forms the leading edge of the output signal 51. At time $T_2$ the second trigger pulse 50 is applied to the input terminal 40 of the transformer 34 to render the transistor 30 conducting. This causes a negative step voltage 64 shown by a dashed line in FIG. 2 to be produced at the left end of the line 10 and to travel along the transmission line from left to right through the conducting transistor 18 to the output terminal 52 to form the trailing edge of the output pulse 51 and cause the transistor 18 to become nonconducting. This negative step voltage 64 is delayed by the time delay L of the transmission line and reaches output terminal 52 as step voltage 64′ after such time delay.

When the transistor 30 is rendered conducting by the trigger pulse 50 a positive step voltage 62 is conducted from the left end of the transmission line, through this transistor to the output terminal 56 to form the leading edge of the output pulse 54. Also when the transistor 18 is rendered conducting by the trigger pulse 48, a negative step voltage 60 shown by a dotted line in FIG. 2, travels along the transmission line from right to left and through the conducting transistor 30 to the output terminal 56 to form the trailing edge of the output pulse 54 and cause the transistor 30 to become nonconducting. This negative step 60 is also delayed by the time delay L of the transmission line and reaches the output terminal 56 as step voltage 60′ after such time delay.

The width $W_1$ of the first output pulse 51 is greater than the width $W_2$ of the second output pulse 54. From the time scale of FIG. 2 it can be seen that $$W_1=L+(T_2-T_1)$$

and $W_2=L-(T_2-T_1)$. From these two expressions it can be seen that $W_1=2L-W_2$ and $W_2=2L-W_1$. Thus, the width of the second output pulse 54 is equal to twice the time delay of the transmission line 10 minus the width of the first output pulse 51. Since the time delay L of the transmission line 10 of FIG. 1 is 50 nanoseconds, the widths of both of the output pulses 51 and 54 will each be equal to 50 nanoseconds when the trigger pulses 48 and 50 are applied to the input terminals 28 and 40 at the same time. In order to produce a first output pulse having a width of 1 nanosecond the trigger pulse 50 is applied to input terminal 40 about 49 nanoseconds before the trigger signal 48 is applied to input terminal 28. This would also produce a second output pulse 54 having a pulse width of approximately 99 nanoseconds. The maximum possible pulse width is equal to twice the time delay of the transmission line since this is the time it takes a negative step voltage to be transmitted from one end of the transmission line to the other end and then reflected back to such one end which would happen if the switching transistor connected to the other end is not rendered conducting until after the step voltage reaches such other end.

The transistors 18 and 30 have very little emitter to collector reactance when conducting as avalanche transistors so that the resistors 24 and 36 terminate the line 10 in its characteristic impedance. As a result, there is negligible signal reflection back along the line 10 of the negative step voltages 60 and 64 which travel along the line 10 providing that any output lines connected to the output terminals 52 and 56 do not change the termination impedance. Thus each of the output lines may be a high impedance line or may be a transmission line having the same characteristic impedance as the line 10 and having a terminating resistor 24 or 36 respectively at its end remote from the respective terminal 52 or 56. It should be noted that the load impedance 24 may have an impedance other than the characteristic impedance of the line 10 without causing any distortion of the output pulse 51 if the termination impedance 36 is equal to such characteristic impedance. The pulse generator thus is a signal source of constant impedance equal to the characteristic impedance of the line 10 as long as the transistors remain conducting.

It will be obvious to one having ordinary skill in the art that various changes may be made in the details of the above described preferred embodiment of the present invention without departing from the spirit of the invention. For example, the transmission line 10 may have a characteristic impedance other than 50 ohms and be terminated with appropriate resistors 24 and 36 equal in resistance to such other characteristic impedance. Therefore the scope of the present invention should only be determined by the following claims.

I claim:

1. A pulse generator, comprising:
   - a transmission line having a signal conductor and a ground conductor;
   - a pair of first and second electronic switch means connected to the opposite ends of said signal conductor;
   - means for applying a D.C. voltage to said signal conductor and for rendering said pair of switch means nonconducting to charge the capacitance of said transmission line; and
   - a first and second means for respectively and independently rendering said first and second switch means conducting to discharge said transmission line so that a single output pulse is produced at the output of at least one of said switch means only after both of said switch means are rendered conducting.

2. A pulse generator in accordance with claim 1 which also includes means for varying the time delay between the initiations of conduction of said pair of switch means in order to vary the width of said output pulse.

3. A pulse generator in accordance with claim 2 in which the output pulse is a rectangular pulse whose leading edge is formed by the conduction of said first switch means and whose trailing edge is formed by the conduction of said second switch means.

4. A pulse generator, comprising:
a transmission line having a signal conductor and a ground conductor;
a charging resistance connected to one end of said signal conductor;
a pair of first and second electronic switch means connected to the ends of said signal conductor;
means for rendering said pair of switch means normally nonconducting;
means for applying a D.C. voltage to said charging resistance to charge the capacitance of said transmission line through said charging resistance when said pair of switch means are nonconducting;
first trigger means for applying a first trigger pulse to said first switch means to render it conducting and to discharge said line; and
second trigger means independently of said first switch means, for applying a second trigger pulse to said second switch means to render it conducting and to discharge said line so that an output pulse is produced at the output of at least one of said switch means only after both of said first and second trigger pulses have been received.

5. A pulse generator for producing electrical output pulses of variable width, comprising:
a transmission line;
a charging resistance connected to one end of said transmission line;
a pair of first and second electronic switch means;
means for connecting the first switch means to said one end of said transmission line and for rendering said first switch means normally nonconducting;
means for connecting the second switch means to the other end of said transmission line and for rendering said second switch means normally nonconducting;
a D.C. voltage source connected to said charging resistance to charge the capacitance of said transmission line through said charging resistance when said pair of switch means are nonconducting;
first trigger means for applying a first trigger pulse to said first switch means to render it conducting and to discharge said line;
second trigger means independent of said first switch means for applying a second trigger pulse to said second switch means to render it conducting and to discharge said line so that an output pulse is produced at the output of at least one of said switch means only after both of said first and second trigger pulses have been received; and
means for varying the time between the applications of said first and second trigger pulses to vary the width of said output pulse.

6. A pulse generator for producing electrical output pulses of variable width, comprising:
a transmission line having a signal conductor and a ground conductor with uniform characteristic impedance conductor;
a charging resistance connected to one end of said signal conductor;
a pair of first and second electronic switching devices connected to the opposite ends of said signal conductor;
means bias for rendering said pair of switching devices normally nonconducting;
a D.C. voltage source connected to said charging resistance to charge the capacitance of said transmission line through said charging resistance;
a load resistance connected between ground and the output of at least one of said switching devices and having a resistance substantially equal to said characteristic impedance to terminate at least one end of said transmission line when said one device is rendered conducting;
first trigger means including a first transformer for applying a first trigger pulse to said first switching device to render it conducting and to discharge said line;
second trigger means independent of said first switching device, including a second transformer for applying a second trigger pulse to said second switching device to render it conducting and to discharge said line so that an output pulse is produced at the output of at least one of said switch means only after both of said first and second trigger pulses have been received; and
means for varying the time between the applications of said first and second trigger pulses to vary the width of said output pulse.

7. A pulse generator for producing electrical output pulses of variable width, comprising:
a transmission line of substantially uniform characteristic impedance having an inner signal conductor and an outer shield conductor connected to ground;
a pair of first and second semiconductor switching devices connected to the opposite ends of said signal conductor and normally biased nonconducting;
a charging resistor having one terminal connected to one end of the signal conductor of said transmission line;
a D.C. voltage source connected to the other terminal of said charging resistor to charge the capacitance of said transmission line to the voltage of said source through said charging resistor;
a pair of first and second transformers each having a primary winding and a secondary winding;
means connecting the secondary winding of said first transformer to the input of said first semiconductor device and the secondary winding of said second transformer to the input of said second semiconductor device so that said first device is rendered conducting when a first trigger pulse is applied to the primary winding of said first transformer, and said second device is rendered conducting when a second trigger pulse is applied to the primary winding of said second transformer to enable said transmission line to discharge; and
a pair of first and second load impedances connected respectively to the outputs of said first and second devices at least one of said load impedances being substantially equal to the characteristic impedance of the transmission line to prevent signal reflections in said line and at least one of said load impedances connected to an output terminal for transmitting output pulses thereto when said transmission line is discharged.

8. A pulse generator for producing electrical output pulses of variable width, comprising:
a coaxial cable transmission line of substantially uniform characteristic impedance having an inner signal conductor and an outer shield conductor connected to ground;
a pair of first and second transistors connected as switches with their collectors connected to the opposite ends of said signal conductor and normally biased nonconducting;
a charging resistor having one terminal connected to one end of the signal conductor of said transmission line;
a D.C. voltage source connected to the other terminal of said charging resistor to charge the capacitance of said transmission line to the voltage of said source through said charging resistor, and to apply a large reverse bias voltage to the collectors of said transistors so that they operate as avalanche transistors;

a pair of first and second transformers each having a primary winding and a secondary winding;

means connecting the secondary winding of said first transformer between the base and emitter of said first transistor and the secondary winding of said second transformer between the base and emitter of second transistor so that said first transistor is rendered conducting when a first trigger pulse is applied to the primary winding of said first transformer, and said second transistor is rendered conducting when a second trigger pulse is applied to the primary winding of said second transformer to enable said transmission line to discharge through said transistors; and a pair of first and second load impedances connected respectively to the emitters of said first and second transistors, at least one of said load impedances being substantially equal to the characteristic impedance of the transmission line to prevent signal reflections in said line, and at least one of said load impedances being connected to an output terminal for transmitted output pulses thereto when said transmission line discharges.

9. A pulse generator for producing electrical output pulses of variable width, comprising:

a coaxial cable transmission line of substantially uniform characteristic impedance having an inner signal conductor and an outer shield conductor connected to ground;

a pair of first and second transistors connected as switches with their collectors connected to the opposite ends of said signal conductor and normally biased nonconducting;

a charging resistor having one terminal connected to one end of the signal conductor of said transmission line;

a D.C. voltage source connected to the other terminal of said charging resistor to charge the capacitance of said transmission line to the voltage of said source through said charging resistor, and to apply a large reverse bias voltage to the collectors of said transistors so that they operate as avalanche transistors;

a pair of first and second transformers each having a primary winding and a secondary winding;

means connecting the secondary winding of said first transformer between the base and emitter of said first transistor and the secondary winding of said second transformer between the base and emitter of said second transistor so that said first transistor is rendered conducting when a first trigger pulse is applied to the primary winding of said first transformer, and said second transistor is rendered conducting when a second trigger pulse is applied to the primary winding of said second transformer to enable said transmission line to discharge through said transistors;

a pair of first and second load impedances connected respectively to the emitters of said first and second transistors at least one of said load impedances being substantially equal to the characteristic impedance of the transmission line to prevent signal reflections in said line, and at least one of said load impedance connected to an output terminal to transmit output pulses thereto when said transistors are rendered conducting; and means for varying the relative time of application of said trigger pulses to said transformers in order to produce output pulses whose widths vary with changes in the time between the applications of said first and second trigger pulses.

10. A pulse generator for producing electrical output pulses of variable width, comprising:

a coaxial cable transmission line of substantially uniform characteristic impedance having an inner signal conductor and an outer shield conductor connected to ground;

a pair of first and second avalanche transistors having their collectors connected to the opposite ends of said signal conductor and normally biased nonconducting;

a charging resistor having one terminal connected to one end of the signal conductor of said transmission line;

a D.C. voltage source connected to the other terminal of said charging resistor to charge the capacitance of said transmission line to the voltage of said source through said charging resistor, and to apply a large reverse bias voltage to the collectors of said transistors so that they operate as avalanche transistors;

a pair of first and second transformers each having a primary winding and a secondary winding, with one end of said primary winding grounded and the other end connected to an input terminal;

means connecting the secondary winding of said first transformer between the base and emitter of said first transistor and the secondary winding of said second transformer between the base and emitter of said second transistor so that said first transistor is rendered conducting when a first trigger pulse is applied to the input terminal of the primary winding of said first transformer, and said second transistor is rendered conducting when a second trigger pulse is applied to the input terminal of the primary winding of said second transformer to cause said transmission line to discharge through said transistors;

means for varying the relative time of application of said first and second trigger pulses to said transformers;

a pair of first and second load impedances connected respectively to the emitters of said first and second transistors, at least one of said load impedances being substantially equal to the characteristic impedance of the transmission line to prevent signal reflections in said line; and means for connecting a pair of first and second output terminals respectively to said first and second load impedances to transmit output pulses therefrom whose widths vary with changes in the time between the applications of said first and second trigger pulses.

References Cited by the Examiner

UNITED STATES PATENTS

| | | | |
|---|---|---|---|
| 2,978,695 | 4/1961 | Dunn | 328—67 |
| 3,093,798 | 6/1963 | Jacobsen | 328—67 |
| 3,096,445 | 7/1963 | Herzog | 307—88.5 |
| 3,141,981 | 7/1964 | Henebry | 307—88.5 |
| 3,175,101 | 3/1965 | Van Dine | 307—88.5 |

ARTHUR GAUSS, *Primary Examiner.*

J. HEYMAN, *Assistant Examiner.*